United States Patent [19]

Kumamoto et al.

[11] Patent Number: 5,196,920
[45] Date of Patent: Mar. 23, 1993

[54] SEMICONDUCTOR INTEGRATED CIRCUIT DEVICE FOR LIMITING CAPACITIVE COUPLING BETWEEN ADJACENT CIRCUIT BLOCKS

[75] Inventors: Toshio Kumamoto; Hiroyuki Kouno, bothh of Itami, Japan

[73] Assignee: Mitsubishi Denki Kabushiki Kaisha, Tokyo, Japan

[21] Appl. No.: 871,655

[22] Filed: Apr. 21, 1992

[51] Int. Cl.$^5$ ...................... H01L 27/00; H01L 23/48
[52] U.S. Cl. ......................................... 357/84; 357/71
[58] Field of Search ........................... 357/68, 71, 84

[56] References Cited

U.S. PATENT DOCUMENTS

| | | | |
|---|---|---|---|
| 4,470,062 | 9/1984 | Muramatsu | 357/84 |
| 4,937,649 | 6/1990 | Shiba et al. | 357/71 |
| 4,958,222 | 9/1990 | Takakura et al. | 357/71 |
| 5,025,304 | 6/1991 | Reisman et al. | 357/71 |
| 5,041,884 | 8/1991 | Kumamoto et al. | 357/68 |
| 5,045,915 | 9/1991 | Hinooka | 357/84 |
| 5,103,288 | 4/1992 | Sukamoto et al. | 357/71 |

FOREIGN PATENT DOCUMENTS

| | | |
|---|---|---|
| 58-39030 | 3/1983 | Japan . |
| 61-180468 | 8/1986 | Japan . |
| 63-155653 | 6/1988 | Japan . |
| 1-67943 | 3/1989 | Japan . |
| 1-297839 | 11/1989 | Japan . |
| 0374971 | 6/1990 | Japan . |
| 2-271656 | 11/1990 | Japan . |
| 56-126956 | 10/1991 | Japan . |

OTHER PUBLICATIONS

Cavaliere et al., "Reduction of capacitive coupling between adjacent dielectrically supported conductors", IBM TDB, vol. 21, No. 12, May 1979, p. 4827.

Primary Examiner—Eugene R. LaRoche
Assistant Examiner—Viet Q. Nguyen
Attorney, Agent, or Firm—Oblon, Spivak, McClelland, Maier & Neustadt

[57] ABSTRACT

A semiconductor integrated circuit device having semiconductor integrated circuit blocks disposed close to each other. An insulating layer is interposed between each adjacent pair of the semiconductor integrated circuit blocks. An electroconductive shield member is formed between the adjacent semiconductor integrated circuit blocks to limit the capacitive coupling therebetween. The shield member is electrically insulated from the semiconductor integrated circuit blocks and is maintained at a predetermined fixed potential.

9 Claims, 8 Drawing Sheets

SEMICONDUCTOR INTEGRATED CIRCUIT DEVICE FOR LIMITING CAPACITIVE COUPLING BETWEEN ADJACENT CIRCUIT BLOCKS

BACKGROUND OF THE INVENTION

1. FIELD OF THE INVENTION

This invention relates to a semiconductor integrated circuit device and, more particularly, to a semiconductor device having a plurality of semiconductor integrated circuit blocks disposed close to each other.

2. DESCRIPTION OF THE RELATED ART

Figure 12:
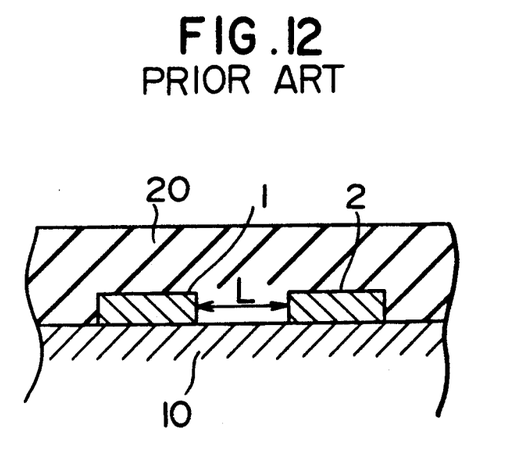
FIG. 12 is a cross-sectional view of an essential portion of the conventional semiconductor integrated circuit.

FIG. 12 is a sectional view of an essential portion of a semiconductor integrated circuit device of this kind. A digital circuit block 1 and an analog circuit block 2 are formed as semiconductor integrated circuit blocks on a substrate 10 formed of a semiconductor or an insulating material. These circuit blocks 1 and 2 are disposed with a spacing L provided therebetween. An insulating layer 20 is formed on the substrate 10 so as to cover the circuit blocks 1 and 2. The circuit blocks 1 and 2 are thereby insulated from each other.

Because the plurality of semiconductor blocks 1 and 2 are disposed close to each other with a portion of the insulating layer 20 interposed therebetween, there is a possibility that noise such as clock noise or switching noise caused, for example, in the digital circuit block 1 is transmitted to the analog circuit block 2 through a parasitic capacitance formed through insulating layer 20 so that the performance of the semiconductor integrated circuit device is deteriorated.

Increasing the spacing L between the circuit blocks 1 and 2 may be considered as a means for preventing this problem. However, the degree of integration of circuit blocks in the semiconductor integrated circuit device is thereby reduced.

SUMMARY OF THE INVENTION

In view of this problem, an object of the present invention is to provide a semiconductor integrated circuit device which has a plurality of circuit blocks formed at a high degree of integration and which is capable of preventing the circuit blocks from badly influencing each other by noise.

According to the present invention, there is provided a semiconductor integrated circuit device comprising a first semiconductor integrated circuit block, a second semiconductor integrated circuit block disposed in the vicinity of the first semiconductor integrated circuit block, a first insulating layer interposed between the first and second semiconductor integrated circuit blocks, and electroconductive shield means formed between the first and second semiconductor integrated circuit blocks to limit the capacitive coupling between the first and second semiconductor integrated circuit blocks, the shield means being electrically insulated from the first and second semiconductor integrated circuit blocks and is maintained at a predetermined fixed potential.

DESCRIPTION OF THE PREFERRED EMBODIMENTS

Figure 1:
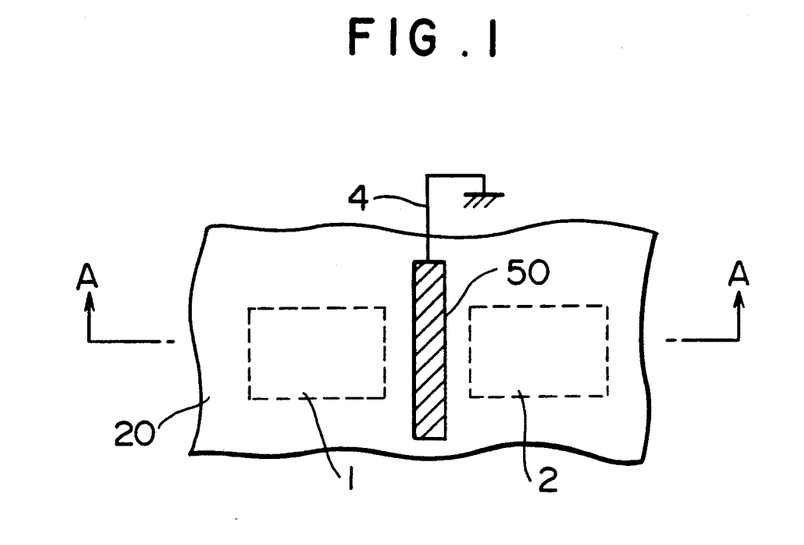
FIG. 1 is a plan view of an essential portion of a semiconductor integrated circuit device in accordance with a first embodiment of the present invention.
Figure 2:
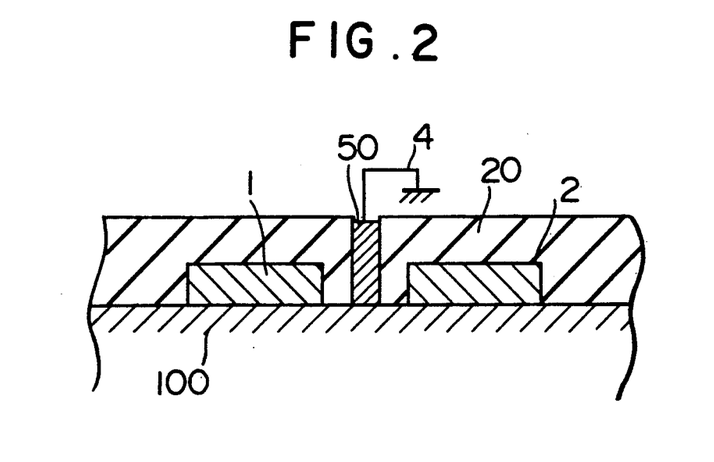
FIG. 2 is a cross-sectional view taken along the line A—A of FIG. 1.

Preferred embodiments of the present invention will be described below with reference to the accompanying drawings. Referring to FIGS. 1 and 2, a digital circuit block 1 and an analog circuit block 2 are formed as semiconductor integrated circuit blocks on a semiconductor substrate 100 while being spaced from each other. A wall-like electroconductive layer 50 which is grounded through a wiring 4 is formed as a shield member between the blocks 1 and 2. An insulating layer 20 is formed between the electroconductive layer 50 and each of the circuit blocks 1 and 2 to electrically insulate the electroconductive layer 50 from the blocks 1 and 2.

The capacitive coupling between the digital circuit block 1 and the analog circuit block 2 can be limited by disposing the electroconductive layer 50 maintained at the ground potential between the circuit blocks 1 and 2 as described above. In this semiconductor device, therefore, even if noise such as clock noise or switching noise is caused, for example, in the digital circuit block 1, it only reaches the wall-like electroconductive layer 50 and does not reach the interior of the analog circuit block 2, so that the operation of the analog circuit block 2 is prevented from being influenced by the noise.

The electroconductive layer 50 may be maintained at a fixed potential and can be maintained at a power supply voltage instead of the ground potential.

Figure 3:
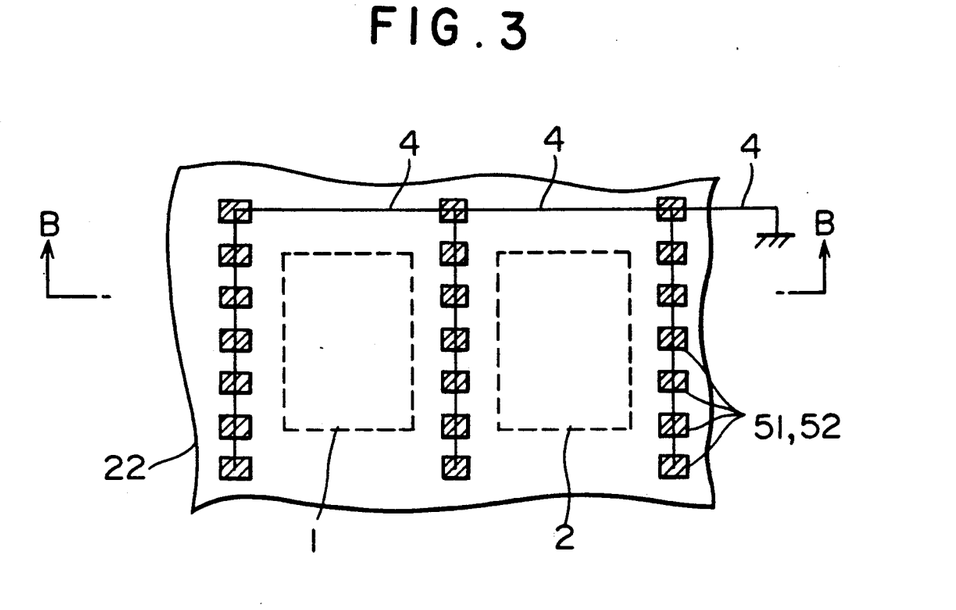
FIG. 3 is a plan view of an essential portion of a second embodiment of the present invention.
Figure 4:
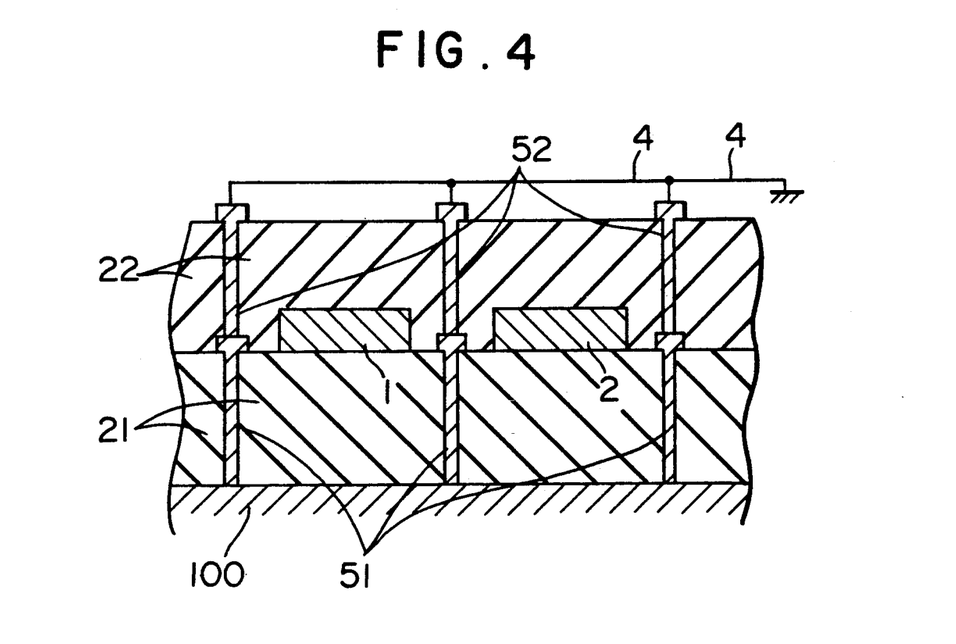
FIG. 4 is a cross-sectional view taken along the line B—B of FIG. 3.

FIGS. 3 and 4 show an essential portion of a semiconductor integrated circuit device in accordance with the second embodiment of the present invention in which semiconductor circuits are formed on an insulating layer formed on a semiconductor substrate, that is, a silicon-on-insulation (SOI) structure is adopted. A first insulating layer 21 is formed on a semiconductor substrate 100. A digital circuit block 1 and an analog circuit block 2 are formed on the first insulating layer 21 while being spaced from each other. A second insulating layer 22 is formed so as to cover these two circuit blocks. A plurality of first and second column-like electroconductive layers 51 and 52 are formed between and around these two circuit blocks. The first column-like electroconductive layers 51 are formed so as to be connected to the surface of the semiconductor substrate 100 and to extend therefrom. Each first column-like electroconductive layer 51 is formed of an impurity-containing semiconductor which is grown as a monocrystal from the semiconductor substrate 100 used as a seed to improve the crystallographic properties of semiconductor layers used for the circuit blocks 1 and 2.

The second column-like electroconductive layers 52 are respectively disposed on the first column-like electroconductive layers 51 so as to pass through the second insulating layer 22. The first and second column-like electroconductive layers 51 and 52 are electrically connected to each other and are grounded through a wiring 4 connected to upper ends of the second electroconductive layers 52. Each second column-like electroconductive layer 52 is formed of an impurity-containing semiconductor as in the case of the first electroconductive layers 51.

In this second embodiment, the same noise shield effects as that in the first embodiment can be obtained by disposing the plurality of first and second column-like electroconductive layers 51 and 52 maintained at the ground potential between the circuit blocks 1 and 2.

Figure 5:
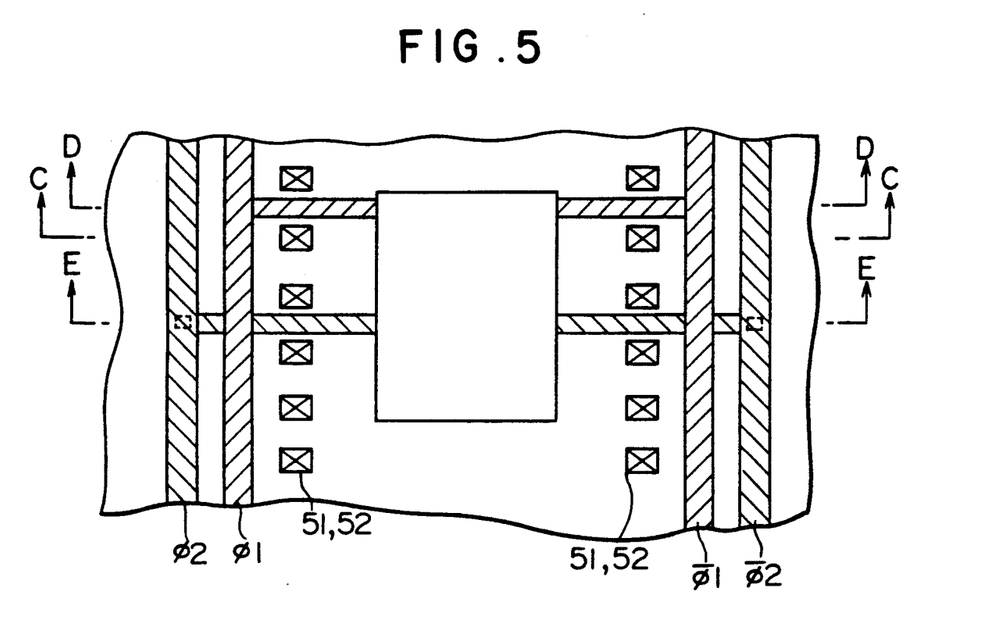
FIG. 5 is a plan view of an essential portion of a third embodiment of the present invention.
Figure 6:
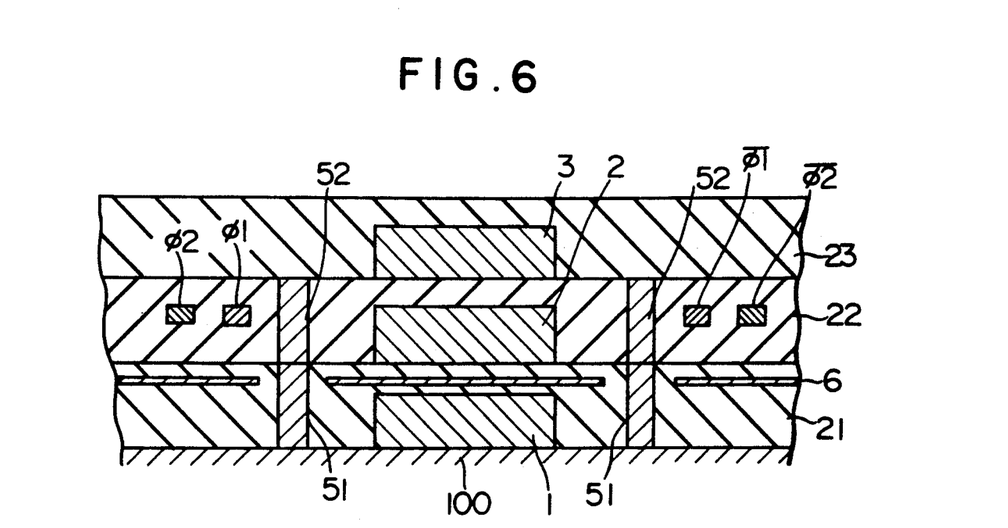
FIG. 6 is a cross-sectional view taken along the line C—C of FIG. 5.
Figure 7:
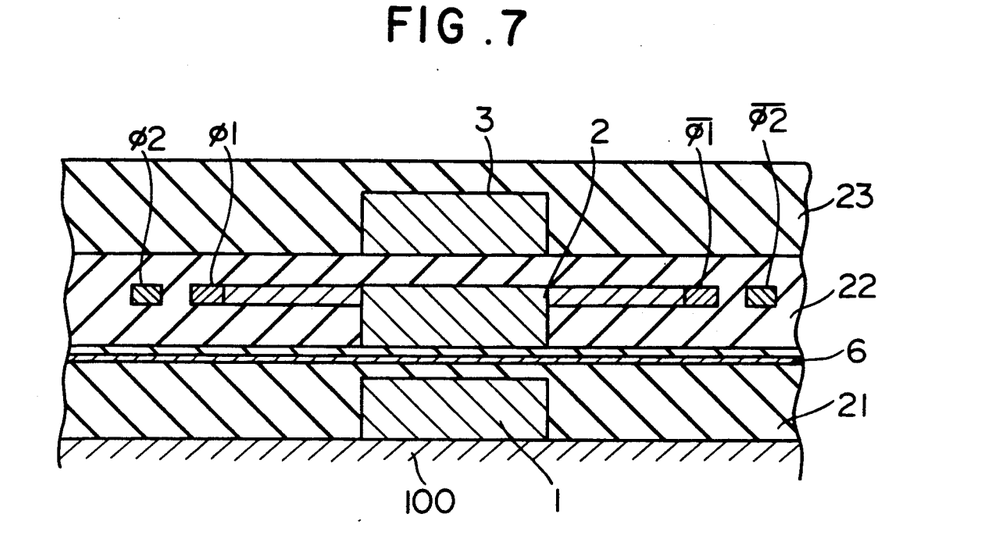
FIG. 7 is a cross-sectional view taken along the line D—D of FIG. 5.
Figure 8:
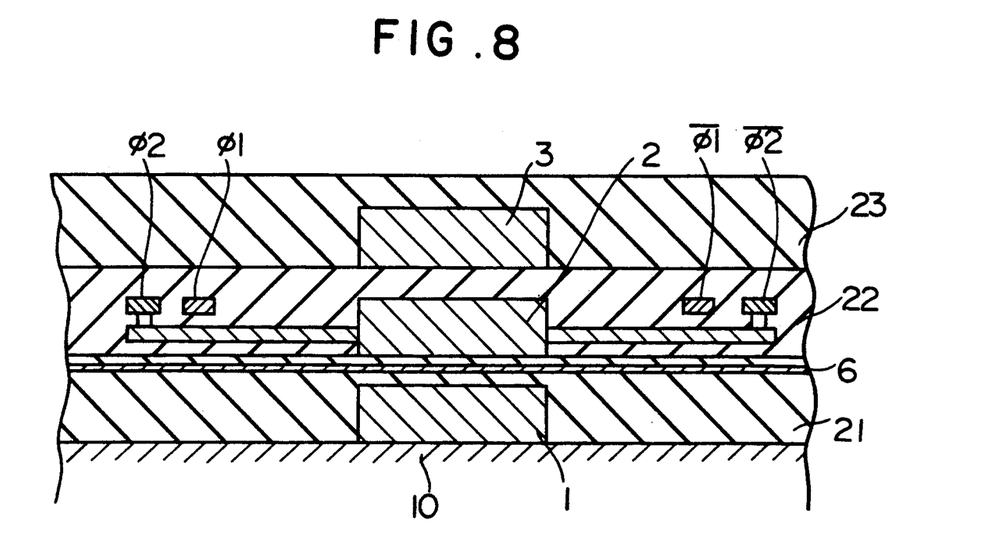
FIG. 8 is a cross sectional view taken along the line E—E of FIG. 5.

FIGS. 5 and 6 show an essential portion of a semiconductor integrated circuit device in accordance with the third embodiment of the present invention. A digital circuit block 1 is formed on a semiconductor substrate 100. A first insulating layer 21 is formed so as to cover the digital circuit block 1. An analog circuit block 2 is formed above the digital circuit block 1 with a shield plate 6 interposed therebetween. A plurality of column-like electroconductive layers 51 and 52 formed of a semiconductor are arranged as noise shields at equal intervals around the digital circuit block 1 and the analog circuit block 2. Clock signal lines $\phi 1$, $\overline{\phi 1}$, and $\phi 2$, $\overline{\phi 2}$ are disposed outside the column-like electroconductive layers. The clock signal lines $\phi 1$, $\overline{\phi 1}$, and $\phi 2$, $\overline{\phi 2}$ are connected to predetermined portions of the analog circuit block 2 by conductors extending between the column-like electroconductive layers 52. As shown in FIG. 6, the column-like electroconductive layers 51 are formed so as to be connected to the semiconductor substrate 100 and are thereby set in a state equivalent to a state of being maintained at a predetermined fixed potential. An external circuit block 3 is formed above the analog circuit block 2 with a second insulating layer 22 interposed therebetween. The external circuit block 3 is covered with a third insulating layer 23.

Figure 9:
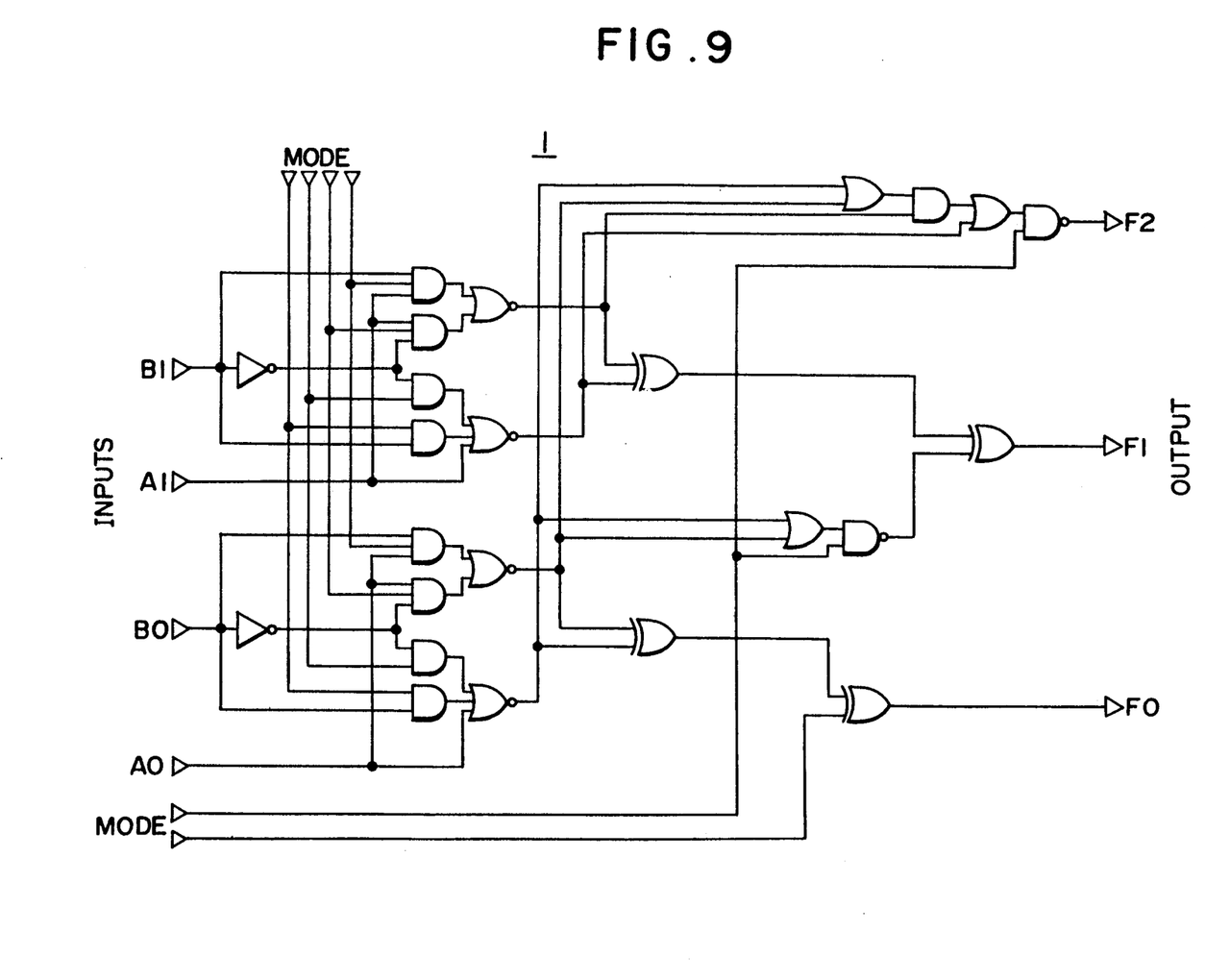
FIG. 9 is a circuit diagram of an example of the digital circuit block of the third embodiment.
Figure 10:
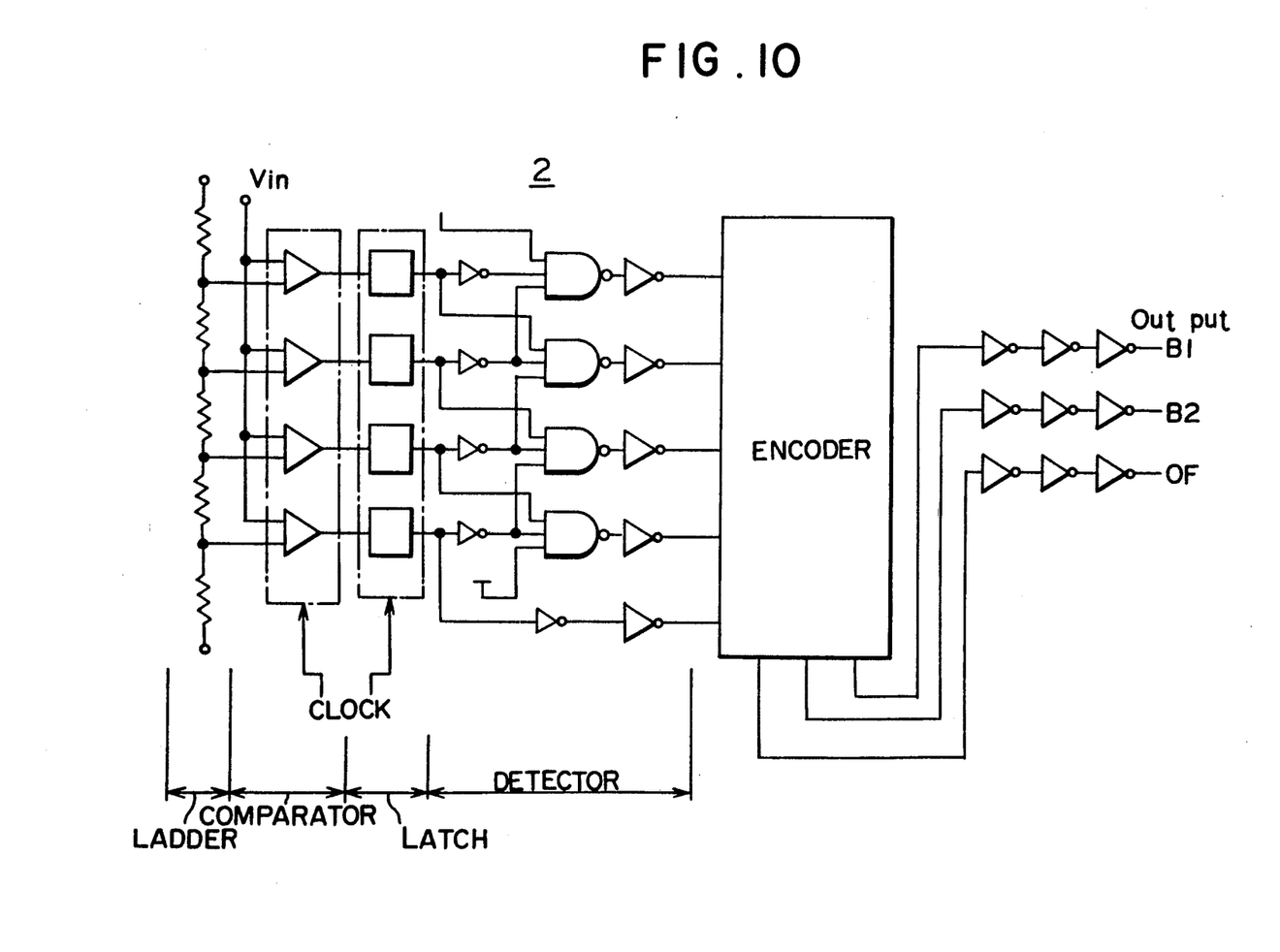
FIG. 10 is a circuit diagram of an example of the analog circuit block of the third embodiment.

For example, an arithmetic logical operation circuit (ALU) such as that shown in FIG. 9 is used as the digital circuit block 1, a 2-bit CMOS A-D converter such as that shown in FIG. 10 is used as the analog circuit block 2, and an image sensor formed of a photosensor is used as the external circuit block 3, thereby forming a semiconductor integrated circuit device having a three-layer-stack structure and used to process image signals.

In a semiconductor integrated circuit device having such a three-layer structure, noise generated in the digital circuit block 1 at the lowermost layer only reaches the shield plate 6 connected to a fixed potential and is prevented from being transmitted to the analog circuit block 2. Also, the plurality of column-like electroconductive layers 51 and 52 serve to limit transmission of clock noise from the clock signal lines to the analog circuit block 2. The operation of the analog block 2 is thereby prevented from being badly influenced by noise.

Figure 11:
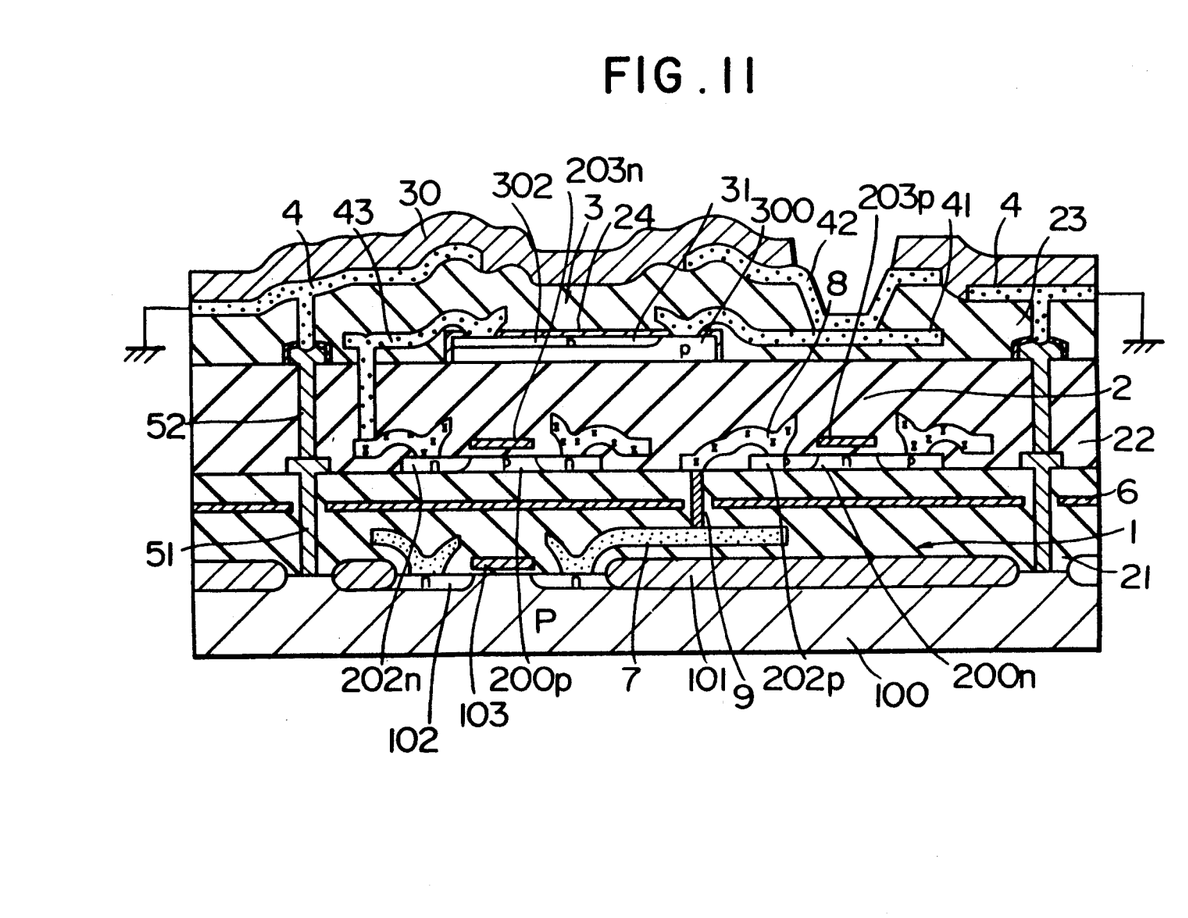
FIG. 11 is a cross-sectional view of details of the three-layer structure of the third embodiment.

FIG. 11 shows a detailed cross-sectional configuration of an example of the three-layer-stack semiconductor integrated circuit device shown in FIGS. 5 to 8. A separation oxide film 101 is formed on a p-type semiconductor substrate 100 so as to surround an element formation region in which a digital circuit block 1 is constructed An n-channel MOS transistor is formed in the element formation region. This MOS transistor has a gate electrode 103 and an n-type impurity diffusion region 102. A first insulating layer 21 is formed of a silicon oxide film by the chemical vapor deposition (CvD) method over the n-channel MOS transistor shown as an example of an element constituting the digital circuit block 1. On the first insulating layer 21, shield plates 6 are formed of polycrystalline silicon doped with impurities. A plurality of first column-like electroconductive layers 51 are formed around the digital circuit block. Each column-like electroconductive layer 51 is formed of an impurity-containing silicon layer grown as a monocrystal from a surface of the semiconductor substrate 100 used as a seed.

In the second layer, elements having a COMS/SOI structure constitute an analog circuit block 2. A p-type semiconductor layer 200p and an n-type semiconductor layer 200n are formed while being spaced from each other. An n-channel MOS transistor is formed on the p-channel semiconductor layer 200p. This n-channel MOS transistor has a gate electrode 203n and an n-type impurity diffusion region 202n. A p-channel MOS transistor is formed on the n-channel semiconductor layer 200n. This p-channel MOS transistor has a gate electrode 203p and a p-type impurity diffusion region 202p. The n-type impurity diffusion region 102 constituting the first-layer MOS transistor is electrically connected to the p-type impurity diffusion region 202p. A wiring layer 7 is formed of polycrystalline silicon doped with impurities so as to be connected to the n-type impurity diffusion region 102. A contact layer 9 is connected to the wiring layer 7. A wiring layer 8 is formed of a tungsten silicide layer so as to be connected to the contact layer 9 and also to the p-type impurity diffusion region 202p. A plurality of second column-like electroconductive layers 52 which are silicon layers containing impurities are formed around the analog circuit block 2 so as to be connected to the first column-like electroconductive layers 51.

An external circuit block 3 constituting the third layer is formed on a second insulating layer 22 formed of a silicon oxide film by the CVD method. A pn photodiode 31 is illustrated as example of an element constituting the external circuit block 3. The pn photodiode 31 has an n-type impurity diffusion region 302 formed in a p-type semiconductor layer 300. A wiring layer 41 formed of a first aluminum layer is connected to the p-type semiconductor layer 300 through a contact hole formed in a silicon oxide layer 24. A wiring layer 42 formed of a second aluminum layer is connected to the wiring layer 41. The n-type impurity diffusion region 302 is connected to the n-type impurity diffusion region 202n constituting the second-layer element by a wiring layer 43. A wiring layer 4 formed of aluminum is connected to upper portions of the second column-like electroconductive layers 52. The wiring layer 4 is maintained at the ground potential. A third insulating layer 23 is formed of a silicon nitride film so as to cover the third-layer element. A passivation film 30 is formed over the wiring layers 4 and 42.

Thus, the structure of the example of the three-layer-stack semiconductor integrated circuit device in accordance with the present invention has been schematically illustrated as viewed in section.

In the example, shown in FIG. 11, silicon layers containing impurities are used as column-like electroconductive layers 51 and 52. However, any material having at least certain electroconductivity may suffice for the electroconductive layers 51 and 52, and such a material may be a high-melting-point metallic silicide or the like.

What is claimed is:

1. A semiconductor integrated circuit device comprising:
   a first semiconductor integrated circuit block;
   a second semiconductor integrated circuit block disposed in the vicinity of said first semiconductor integrated circuit block;
   a first insulating layer interposed between said first and second semiconductor integrated circuit blocks; and
   electroconductive shield means formed between said first and second semiconductor integrated circuit blocks to limit the capacitive coupling between said first and second semiconductor integrated circuit blocks wherein said sheild means is formed of an impurity containing semiconductor material electrically insulated from said first and second semiconductor integrated circuit blocks and is maintained at a predetermined fixed potential.

2. A device according to claim 1 wherein said first semiconductor integrated circuit block is a block having a digital circuit, and said second semiconductor integrated circuit block is a block having an analog circuit.

3. A device according to claim 1 wherein said shield means comprises a wall-like electroconductive layer.

4. A device according to claim 1 wherein said shield means comprises a plurality of column-like electroconductive layers.

5. A device according to claim 4 wherein said shield means is formed of a semiconductor which is grown as a monocrystal in a seed hole formed in said first insulating layer and which contains an impurity.

6. A device according to claim 1 further comprising a substrate having a surface on which said first and second semiconductor integrated circuit blocks are juxtaposed.

7. A device according to claim 1 further comprising a substrate on which said first semiconductor integrated circuit block is formed, said second semiconductor integrated circuit block being formed above said first semiconductor integrated circuit block with said first insulating layer interposed therebetween.

8. A device according to claim 7 further comprising:
   a second insulating layer formed over said second semiconductor integrated circuit block; and
   a third semiconductor integrated circuit block formed on said second insulating layer.

9. A device according to claim 4 further comprising a clock signal line for supplying a clock signal to said second semiconductor integrated circuit block, said clock signal line being connected to said second semiconductor integrated circuit block through a path located between a pair of adjacent layers of said plurality of column-like electroconductive layers wherein said column-like electroconductive layers limit clock noise generated in said clock signal line from adversely affecting said second semiconductor integrated circuit block.

* * * * *